Nov. 15, 1966 C. M. HENDERSON ET AL 3,285,017

TWO-PHASE THERMOELECTRIC BODY COMPRISING A SILICON-GERMANIUM MATRIX

Filed May 27, 1963 2 Sheets-Sheet 1

INVENTORS
COURTLAND M. HENDERSON
EMIL R. BEAVER JR.

BY

Herman O. Bauermeister
Attorney

TEMPERATURE °C

INVENTORS
COURTLAND M. HENDERSON
EMIL R. BEAVER JR.
BY Herman O. Bauermeister
Attorney

United States Patent Office 3,285,017
Patented Nov. 15, 1966

3,285,017
TWO-PHASE THERMOELECTRIC BODY COMPRISING A SILICON-GERMANIUM MATRIX

Courtland M. Henderson, Xenia, and Emil R. Beaver, Jr., Tipp City, Ohio, assignors to Monsanto Company, a corporation of Delaware Filed May 27, 1963, Ser. No. 283,195
11 Claims. (Cl. 62—3)

Figure 1:
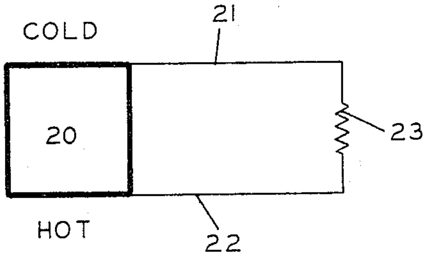

This application is a continuation-in-part of copending applications Serial Nos. 169,501; 169,283; 169,536; 169,395; 169,209; 169,210; 169,579 all filed January 29, 1962.

The present invention relates to thermoelectricity, novel thermoelectric materials and elements thereof and processes for their manufacture. It is an object of the invention to provide greatly improved thermoelectric combinations relative to presently known materials and devices. It is also an object of the invention to manufacture these novel thermoelectric elements and devices by improved processes in order to control thermoelectric and lattice strain properties thereof. It is an object of the invention to produce conditions of proper matrix strain that will not fade or be lost as rapidly when the thermoelectric material is used at high temperatures. It is a further object of the invention to provide a method for producing said thermoelectric materials in a form which will provide either for the conversion of heat into electricity or the removal of heat by electricity at efficiencies significantly greater than are presently possible with currently available thermoelectric materials and devices.

One of the greatest obstacle preventing the more widespread commercialization of thermoelectric devices is the lack of materials of sufficient effectiveness, i.e., having sufficiently high merit factors to yield cooling, heating and power generating devices of thermal efficiencies high enough to make them economically competitive with their conventional mechanical counterparts. The relation of thermoelectric parameters to Z, a merit factor of importance for heating, cooling and power generation applications, is shown below $$Z=S^2/\rho K$$

where $S$=the Seebeck coefficient,
$\rho$=electrical resistivity, and
$K$=thermal conductivity The higher the Z factor, the geater is the amount of refrigeration, heating or power generation that can be obtained from a thermoelectric material for a given energy throughput. The lower the product of the resistivity and the thermal conductivity, the higher the merit factor, when the Seebeck coefficient remains constant.

As is well recognized by those skilled in this art, thermoelectric materials have not yet been produced that will simultaneously exhibit high Seebeck coefficients, low electrical resistivities and low thermal conductivities to yield high enough merit factors and efficiencies to make devices based on thermoelectricity economically competitive with conventional power generating and cooling devices.

Various routes have been followed in an attempt to overcome this obstacle. For example, attempts have been made to increase the merit factors of materials by decreasing the product of the resistivity and thermal conductivity through increasing the mobility of the carriers (e.g., electrons and/or holes) relative to the thermal conductivity of thermoelectric materials through the use of materials composed of atoms having large atomic weights. The top merit factors for power generation materials operating at temperatures of 700° C. and higher have been below $0.6\times10^{-3}/°$ C.

Another popular approach has been to produce alloy type thermoelectric materials in which a homogeneous distribution of constituents in the alloy is obtained by solid solution, so as to decrease the product of the resistivity and the thermal conductivity of thermoelectric materials. This solid solution or alloy approach has resulted in less than a 10% increase in the Z merit factor for a given thermoelectric material and such materials exhibit poor mechanical properties. More important, the beneficial effect of the homogeneous distribution obtained by the alloy approach is lost after a short time when such thermoelectric materials are used at high temperatures for power generation.

Another approach has been to form physical voids or holes in a given thermoelectric material. While some slight increase in the Seebeck coefficient occasionally results from this approach, improvement in the merit factor possible through this means is usually less than 5%. The presence of voids (filled with a vacuum, air or other gas) has reduced the strength and other mechanical properties of thermoelectric materials so that serious reductions in the life and performance of devices made from such materials more than offset the small gains in the efficiency obtained. In addition, it has been impractical to adequately control the concentration and placement of the voids to obtain the best results. Prior art has held that the presence of insoluble inclusions in the thermoelectric materials is detrimental to obtaining high Z factors.

Still another approach of the prior art has been to improve the merit factors of thermoelectric materials by introducing strain into their solid state lattice structure. Such lattice strain is usually accomplished by placing the material under high stress during fabrication or by a combination of precipitating a small particle phase simultaneously with stressing the lattice during fabrication. This approach results in only a temporary improvement in power generation and cooling characteristics of such materials since the precipitated phases and redissolved and the lattice strain lost when they are exposed to elevated temperatures.

The above problems are overcome and significant increase in the merit factor of thermoelectric materials is possible in accordance with the improvement of the present invention. This invention follows an opposite approach from prior art teachings in that a specific dispersant is used to modify the structure of a specific matrix material, namely, the combinations of germanium and silicon in the range between 75 mole percent germanium and 25 mole percent silicon to 20 mole percent germanium and 80 mole percent silicon. The dispersants employed in the aforesaid germanium-silicon combinations represent an opposite approach from prior art teachings in that at least one stable binary compound or combination of compounds of the group of sulfides, oxides, borides, carbides, nitrides, silicides and phosphides of boron, thorium, aluminum, magnesium, calcium, titanium, zirconium, tantalum, silicon, vanadium, hafnium, columbium, tungsten, iron, tin, cobalt, nickel, rhenium, molybdenum, beryllium, barium, and rare earths of the lanthanide and actinide series is dispersed within the germanium-silicon thermoelectric matrix material.

The above dispersant-modified germanium-silicon combination may also be doped with various elements, as well as compounds and physical combinations thereof to yield n and p type thermoelectric materials capable of long-life at elevated temperatures. Dopants are distinguished from dispersants in that dopants are quite soluble, e.g., more than 10 mole percent soluble at a temperature corresponding to 60% of the absolute melting point temperature of the matrix, while dispersants are less soluble than this figure.

It is noted that the dispersants are always present as insoluble phases throughout their ranges of concentration, since their solubility and chemical reactivity are always less than the 10% limit expressed above.

The materials of this invention are to be distinguished from nonstoichiometric compounds or solid solutions of conventional semiconductor or thermoelectric materials. Further, they are to be distinguished from the impurity compounds and randomly dispersed inclusions resulting from the reaction of the matrices of conventional semiconductor or thermoelectric materials with their environments, such as oxygen, during processing. The size, spacing and concentration of the dispersants of this invention in germanium-silicon matrices permit significantly greater variations and control of the relation between its electrical resistivity and thermal conductivity and to some extent the Seebeck coefficient than has been possible with prior art practices. This is done by causing the dispersant or additive particles, which are largely insoluble in the matrix materials, to be placed close enough to each other so as to affect the lattice structure of the matrix materials and to impede the flow of thermal energy, as by phonons, more than the flow of electrical charge carriers (electrons, holes, ions and other carriers). Dispersion of such additive particles usually has a beneficial effect on the Seebeck coefficient, but the main result is to permit a long-life net decrease in the product of the resistivity and the thermal conductivity with a correspondingly long-life increase in the merit factor for the aforesaid thermoelectric materials.

From the viewpoint of optimizing device performance it is also desirable to provide semiconductor or thermoelectric materials in which the resistivity and thermal conductivity can be controllably varied along energy flow paths. Ability to vary and control the thermoelectric parameters such as the Seebeck coefficient, electrical resistivity and thermal conductivity for both p and n type materials, through use of additives or dispersants as prescribed herein produces significant and more permanent merit factor increases for the modified thermoelectric materials as compared with unmodified ones. In addition, the dispersion of the presently characterized small strong particles or nuclei through the matrix of semiconductor or thermoelectric materials adds appreciably to their strength and other physical properties. For example, when semiconductor materials are to be used at temperatures high enough to cause their destruction by oxidation, presence of the dispersed refractory materials in the matrix thermoelectric material improves their resistance to such attack. Further the presence of these dispersed particles enhances the bonding of ceramic type coatings, as well as the bonding of electrical and thermal leads to the thermoelectric element, since it is thus possible to more readily join an oxide or refractory protective coating or heat resistant electrical and thermal leads to the improved matrix thermoelectric materials by sintering the protective coating or lead elements to the surface of the matrix material where the dispersed particles are present. For example, it is found that aluminum oxide dispersed in a matrix of germanium-silicon greatly improves the bonding of a protective high temperature coating of nickel oxide to the matrix material.

This invention includes a process for manufacturing thermoelectric elements of improved merit factors by inducing strain into the lattice of the semiconducting matrix materials, in order to obtain improved merit factors by the use of refractory phases of the aforesaid group of dispersants which have different coefficients of expansion than the germanium-silicon semiconductor or thermoelectric matrix materials in which they are dispersed. This practice is most useful for power generating and high temperature heating-cooling devices in which the thermoelectric material is to be heated to high operating temperatures.

The induction of stress or strain by either of the above methods into the matrix thermoelectric material lattice offers an additional means of preferentially causing the thermal conductivity of such matrix materials to decrease more than the electrical resistivity increases, since the flow of heat by phonons can be preferentially impeded more than the flow of charge carriers (electrons, ions, and holes). The dispersed particles serve to lock or retain for significantly longer periods (as compared with prior art methods) of time the desired degree of strain within the matrix lattice by preventing or greatly retarding the flow of dislocations that would release such strain, or stress, within the lattice.

Figure 2:
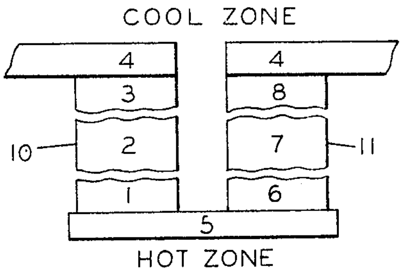
Figure 4:
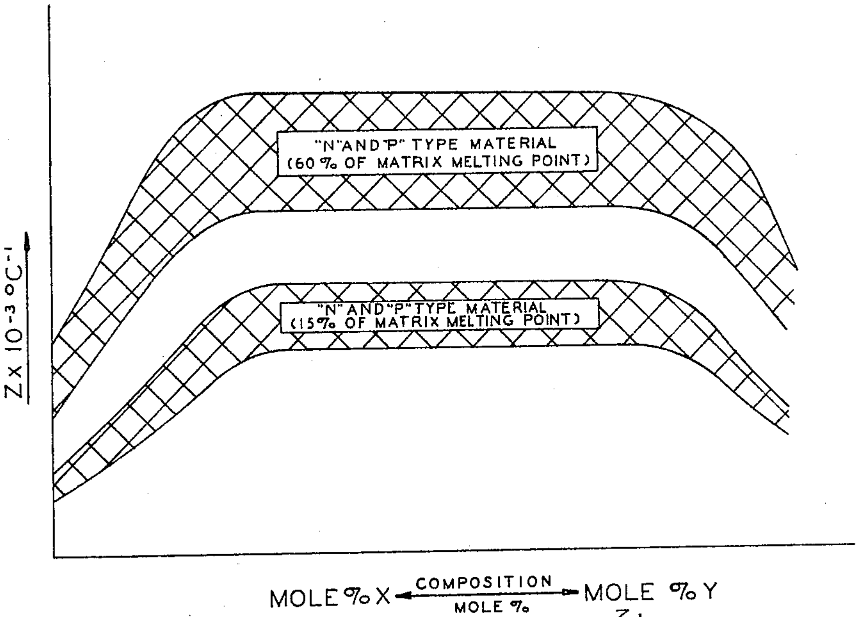
Figure 3:
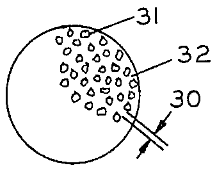
Figure 7:
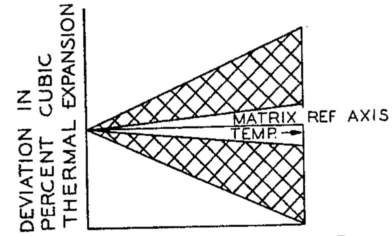
Figure 6:
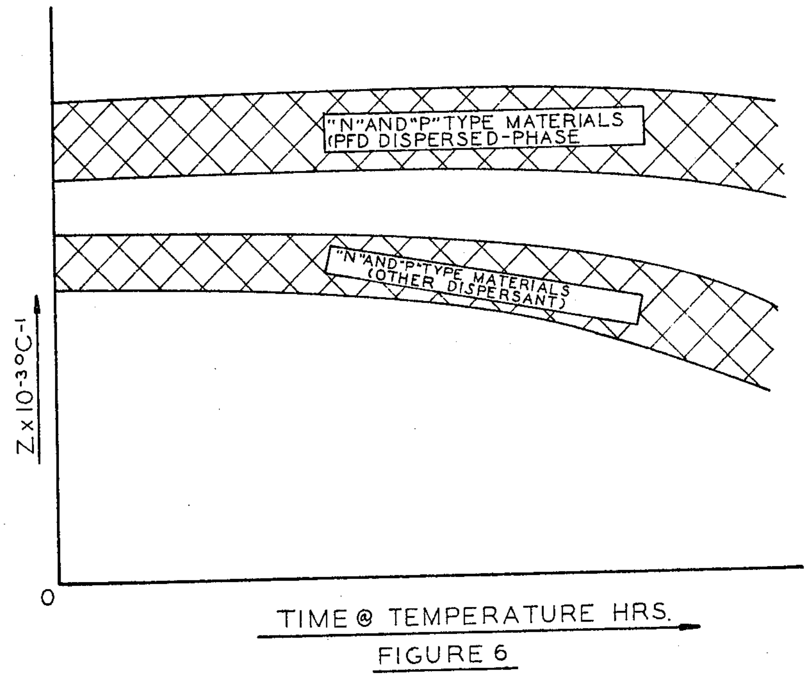
Figure 5:
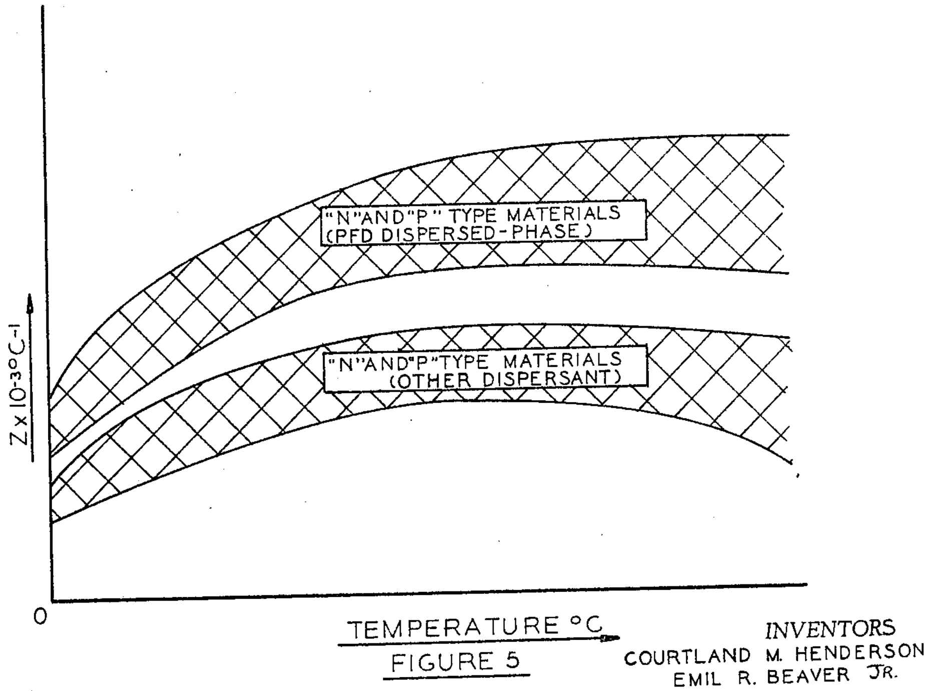

The drawings of the present invention illustrate specific devices of the present invention and the use thereof for interconverting heat and electrical energy, e.g., by applying one of the aforesaid forms of energy and withdrawing the other of the aforesaid forms of energy from opposed regions of a shaped body of the present modified thermoelectric materials. FIGURE 1, presents a typical cooling, heating or power generating circuit in which units of the present invention are useful. FIGURE 2 shows a typical cooling-heating or power generating type unit in which elements made of the dispersed particle thermoelectric materials of this invention are demonstrated. FIGURE 3 shows the details of the microstructure of a compacted thermoelectric element made from the materials of this invention. FIGURE 4 presents plots of typical merit factors at two temperature ranges for various germanium-silicon compositions of this invention. FIGURE 5 presents a comparison over a range of temperatures of the merit factors of prior art p and n type germanium-silicon versus merit factors of the dispersed phase materials of this invention. FIGURE 6 shows that the merit factors of typical prior art p and n type germanium-silicon materials decrease more rapidly with time, under high temperature power generating and cooling conditions, than the merit factors of the same composition matrix modified by the teachings of this invention. FIGURE 7 shows the critical relationship of the percent cubic thermal expansion of the dispersant and the matrix.

The thermoelectric compositions contemplated by this invention are obtained by controlling the composition to contain broadly from 0.001 mole percent to 29 mole percent of at least one small particle refractory phase as defined below, which is homogeneously dispersed through a matrix of consolidated germanium-silicon thermoelectric material, the balance of the composition substantially being made up of the matrix material. A more preferred composition contains from 0.01 mole percent to 20 mole percent of at least one small particle refractory phase dispersed through a matrix of thermoelectric material. The most preferred composition contains from 0.1 mole percent to 15 mole percent of the small particle refractory phase dispersed through a matrix of the thermoelectric material. In general, the dispersed phase should be substantially insoluble (less than 10 mole percent at 60% of the melting point temperature, absolute, of the matrix), and otherwise meet the criteria that the melting point (absolute temperature) of the refractory phase should exceed the melting point (absolute temperature) of the matrix material in which they are dispersed, by a factor of 5%. More preferably, the melting point of the dispersed phase should exceed the melting point of the matrix material by 10%. Most preferably, the absolute melting point of the refractory dispersed phase should exceed that for the matrix by 15%, or more, e.g., 115% of matrix m.p.

The fine particles of dispersants employed in the present invention are present in the germanium-silicon matrix in a molecular degree of dispersion. Broadly, the size of the particles of dispersed phase should be larger than 50 A. but not exceeding 500,000 A. with preferred sizes ranging from 100 A. to 400,000 A. and most preferably from 200 to 350,000 A. The interparticle distances of such small size particles employed in the present limits of concentration set forth above range from 50 A. to 500 A. A more preferred interparticle spacing of the dispersed particles in the germanium-silicon matrix is from 100 A. to about 350,000 A. with the most preferred interparticle spacing for optimum properties ranging from 200 A. to about 200,000 A. The distribution of the above group of sulfides, oxides, borides, carbides, nitrides, silicides, and phosphides employed as dispersants in the stated proportions and particle sizes is illustrated in FIGURE 3 wherein the element 31 shows the said refractory dispersants distributed in the matrix 32. The individual particles 31 have the average particle sizes set forth above, and the interparticle distance is shown as 30.

In FIGURE 4, the composition of the germanium-silicon matrix (exclusive of dopants) of the thermoelectric material in which the small particles are dispersed, is broadly defined to range from 75 mole percent germanium (X component of FIGURE 4) and 25 mole percent silicon (Y component of FIGURE 4) to 20 mole percent germanium with 80 mole percent silicon. A more preferred range of matrix composition is between 70 mole percent germanium with 30 mole percent silicon and 25 mole percent germanium with 75 mole percent silicon. A still more preferred range of matrix compositions is between 65 mole percent germanium-35 mole percent silicon and 28 mole percent germanium-72 mole silicon. Dopants of the p type for germanium-silicon, such as aluminum, gallium and boron in the range of $1\times10^{-2}$ mole percent to 15 mole percent of the thermoelectric matrix are used. For n type germanium-silicon, dopants such as arsenic, antimony and selenium in the range of $1\times10^{-2}$ mole percent to 15 mole percent of the thermoelectric matrix are useful.

The present invention is based upon the use of a specific group of the above sulfides, oxides, borides, carbides, nitrides, silicides and phosphides, namely those which have particular ranges of values for their arithmetic deviation in percent of cubic thermal expansion from that of the matrix. The dispersants of the present class are those having a percentage of cubic thermal expansion, up to 1000° C., which deviates from that of the matrix by sufficient degree to make the differential thermal expansion of the dispersant (relative to that of the matrix) cause strains to be set up in both materials due to nonlinear expansion and contraction with changes in temperature. These ranges lie within the cross-hatched areas established in FIGURE 7 relative to the percent cubic thermal expansion of the matrix shown as the central horizontal axis represented as a temperature scale increasing to the right. These ranges include dispersant materials whose percentage of cubic thermal expansion deviates arithmetically from that of the particular matrix by a deviation of from 1.03% to 4.00% over the temperature range of from 0° C. to 1000° C. A more preferred range is 1.19% to 4.00% deviation, while the most preferred range is from 1.35% to 4.00% deviation.

The percentage of cubic thermal expansion referred to above is defined as the difference in volume of a dispersant material over a temperature range of from 0° C. to a given higher temperature (e.g., 100° C.) divided by the volume of material at 0° C. and multiplied by 100. This range broadly includes materials that expand or contract volumetrically with temperature, within the limits of elasticity of the dispersant and the matrix.

As an example of the use of the above criteria the 30 mole percent Ge-70 mole percent Si composition, having an approximate 1.20 cubic thermal expansion over a 0–1000° C. range, is modified with about 1 mole percent CaO dispersant having an approximate cubic thermal expansion over a 0–1000° C. range. The deviation of the expansion of the dispersant from that of the matrix is 2.91%. This 2.91% falls in the 1.35% to 4.00% deviation range specified with the resulting stresses on matrices and dispersants being well under their elastic limits. Thus, by thermal expansion criteria, calcium oxide is considered to be a useful dispersant of the present invention.

The following examples illustrate specific embodiments of the present invention and show various comparisons against prior art compositions and materials. The shaped bodies of the various thermoelectric compositions are formed by consolidating the particulate components; the thermoelectric units are then made by attaching leads, after which measurements are made to determine the merit factor Z with respect to cooling and power generating characteristics. The specific preferred dispersants used prevent recrystallization at high temperatures.

*Example 1*

As a specific example of typical results obtainable through the teachings of this invention in producing superior high temperature power generating materials and devices, 14 mole percent of calcium oxide consisting of particles ranging in size from 100 A. to 10,000 A. is homogeneously distributed through a germanium (30 mole percent)-silicon (70 mole percent) p type matrix doped with 0.5 mole percent of boron so that the approximate average interparticle spacing between the calcium oxide particles in this doped matrix is 280 A. after compacting at 950° C. and 500 p.s.i. The Z factor of a 14 mole percent boron nitride modified germanium (30 mole percent)-silicon (70 mole percent) matrix material is $0.5\times10^{-3}/°$ C. at about 800° C. The Z factor for the calcium oxide modified germanium-silicon matrix with dispersed calcium oxide is $1.1\times10^{-3}/°$ C. at about 800° C. or about 60% of the melting point of the matrix, is shown in FIGURE 4, or about 120% higher than the Z factor for the boron nitride modified specimen of the same composition for the same operating temperatures, as indicated in FIGURE 4. The merit factor for a complementary n type germanium (30 mole percent)-silicon (70 mole percent) doped with 0.5 mole percent arsenic is similarly increased from $0.6\times10^{-3}/°$ C. by fabricating elements in which 14 mole percent of the same size calcium oxide particles are homogeneously dispersed.

The percent cubic thermal expansion and deviations are shown in the table below:

| | Percent at 800° C. | Deviation percent |
|---|---|---|
| Ge-Si | 1.05 | 0 |
| CeO | 3.15 | 2.10 |
| BN | 1.23 | 0.18 |

*Example 2*

A specific example of typical results obtained when a conventional high temperature heating-cooling type thermoelectric material is modified by the teachings of this invention is shown with a p type germanium (30 mole percent)-silicon (70 mole percent) matrix doped with 0.5 mole percent boron, modified by having dispersed within it 8 mole percent of thorium oxide. Particle size of the thorium oxide additive ranges in size from 150 A. to 200,000 A. This composition is compacted at 1250° C. under 1000 p.s.i. The resulting compacts show interparticle spacings between the additive dispersant particles varying from 200 A. to 350,000 A. The Z factor of a boron doped, boron nitride modified p type matrix processed in the same die and at the same pressure and temperature is only $0.45\times10^{-3}/°$ C., e.g., as compared with $0.9\times10^{-3}/°$ C., for the dispersed thorium oxide additive-modified but otherwise same composition matrix material when tested under the same conditions. This represents an increase of about 100% in the merit factor for the modified over the doped, boron nitride modified germanium silicon material of the same composition.

Similarly, significant increases in the merit factors of p and n type germanium-silicon composition matrix materials of this invention are obtained by dispersing refractory compounds such as carbides, oxides, phosphides, borides, silicides, sulphides, and nitrides to meet the prescribed particle size and interparticle spacing conditions, ratios of the melting points of the dispersants to the melting points of the matrices, deviation in percent of cubic thermal expansion and low solubility of the dispersants in the matrix criteria.

The percent cubic expansion and deviations are shown in the table below:

| | Percent at 800° C. | Deviation percent |
|---|---|---|
| Ge-Si | 1.05 | 0 |
| $ThO_2$ | 3.30 | 2.25 |
| BN | 1.23 | 0.18 |

Various methods are used for producing the modified thermoelectric materials of this invention. In general, powder metallurgy and ceramic fabrication methods are employed. Such methods make use of fine particle powders which are compacted into final or intermediate shapes at elevated pressures and temperatures. Fine particle powders of rounded or near spherical shapes are preferred, but irregularly shaped powder particles are satisfactory. Pressure forming, as by mechanical dies, hydrostatic compaction, and hot or cold extrusion followed by sintering may be used. Hot-pressing is also used, if care is taken to carry out the operation at temperatures and under protective atmospheres that will not damage the thermoelectric matrix material through harmful phase changes, melting or loss of components through oxidation and evaporation.

One preferred method of producing the improved thermoelectric units, characterized by homogeneous dispersion is to mechanically blend fine particle powders of predoped p and n type germanium-silicon thermoelectric matrix materials with the proper proportions of an insoluble dispersant. Such blended powder is then charged into a metal die where it is compacted to a minimum of 75% of theoretical density (for any given composition) under pressures ranging from 0.25 to 200 ton per square inch. For low (less than 500° C.) temperature materials and devices, the compacted powder blend can be formed directly into a unit to which are attached electrical and thermal leads, such as elements 4 and 5 of FIGURE 2. The same procedure can also be used for high temperature units, but it is often more practical to attach high temperature leads in a separate action, as by spot welding or brazing.

Sintering of the compacted elements using temperatures as high as 95% of the melting point of the matrix material improves the physical properties of the compact. In many cases, it is advantageous to attach the electrical and thermal leads to the compacted thermoelectric element during this sintering step.

High-temperature plasma spraying equipment is used to produce modified germanium-silicon thermoelectric units like element 20 of FIGURE 1. In FIGURE 1 are also shown leads 21 and 22 which electrically join the thermoelectric element 20 to electrical circuitry 23 which represents a power source in a cooling unit, or various electric elements such as motors, electric lights, etc., when element 20 is used for generating electricity. The above described thermoelectric units of germanium-silicon are also employed as generating elements 10 and 11 in FIGURE 2. FIGURE 2 represents a thermoelectric device in which a thermally and electrically conductive element 5 contacting elements 10 and 11 is located in a hot zone while leads 4 are located in a cool zone while maintaining electrical and thermal contact with the thermoelectric elements 10 and 11.

*Example 3*

Specifically, when a germanium (30 mole percent)-silicon (70 mole percent) powdered matrix material is mechanically blended with 7 mole percent of silicon nitride and the mixture hot-extruded at 500° C. and 5 tons per square inch, thermoelectric elements are produced which exhibit Z factors of about $0.9\times10^{-3}/°$ C. at 850° C. as indicated in FIGURE 5. The same matrix material, terial, with a 7 mole percent boron carbide dispersant added, yields elements with merit factor of less than $0.5\times10^{-3}/°$ C. at 850° C. as shown in FIGURE 5. Thus, an increase of 80% in the Z factor results in this case through the use of silicon nitride homogeneously dispersed through a matrix (element 32 of FIGURE 3) of doped p type germanium (30 mole percent)-silicon (70 mole percent) and arsenic doped n type germanium (30 mole percent)-silicon (70 mole percent). The average spacing (element 30 of FIGURE 3) between particles of the dispersant in both matrices is 1000 A. and the particles of dispersant (element 31 of FIGURE 3) range in size 50 A. to 200,000 A.

When a thermoelectric cooling unit for use at elevated temperature and consisting of the above materials, equipped with junctions and leads such as elements 21 and 22 of FIGURE 1, is connected in series with a power source, element 23 of FIGURE 1, the temperature difference between the hot and cold junctions, which is indicative of the cooling and heating capacities for the modified thermoelectric material is about 20% greater than for the case of the unmodified materials.

Similarly, beneficial effects are attained when 0.001 mole percent to 29 mole percent of the oxides, borides, phosphides, sulphides, silicides, carbides, and nitrides are employed within the limits of particle size, interparticle spacing, melting point and percent expansion specified to n type germanium-silicon.

The percent cubic expansion and deviations are shown in the table below:

| | Percent at 800° C. | Deviation percent |
|---|---|---|
| Ge-Si | 1.11 | 0 |
| SiN | 2.70 | 1.59 |
| $B_4C$ | 1.35 | 0.24 |

*Example 4*

When thermoelectric elements are to be used over a large temperature differential, it is important to provide such elements with a gradation in properties along the path of energy flow and particularly heat flow through such elements.

In this example, p type germanium (30 mole percent)-silicon (70 mole percent) and n type germanium (30 mole percent)-silicon (70 mole percent) matrices are modified with thorium oxide, respectively.

Whether for cooling, heating or power generation, heat flow occurs from the hot zone to the cold zone through composite elements or legs 10 and 11 of FIGURE 2. For a case when a device of the configuration of FIGURE 2 is used to generate power, element 10 (as shown) consists of 3 segments; elements 1, 2 and 3. For high efficiency of energy conversion, element 1 should have about the same merit factor as elements 2 and 3. Likewise, element 6 of leg 11 has about the same merit factor as elements 7 and 8. For the case at hand, element 10 consists of a n type material while the polarity of element 11 is p type. Element 5 of FIGURE 2 is in electrical and thermal contact between legs 10 and 11 and the energy source, or hot zone. Element 4 serves as electrical and thermal contact for the cold side of the thermoelectric unit of FIGURE 2.

A superior generator is obtained when elements 10 and 11, consisting, respectively, of n and p type germanium-silicon matrix materials are mechanically strengthened and thermoelectrically improved by dispersions of the above additives. The thermoelectric elements for this generator unit, similar in construction to that shown in FIGURE 2, are produced as follows:

Mechanical blends of fine particle (500 A. to 450,000 A.) of n type germanium-silicon modified with fine particle thorium oxide (100 A. to 350,000 A.) are produced. The blend for element 1 consists of a mixture of a nominal 12 mole percent thorium oxide in n type germanium-silicon. This powder blend is poured into the bottom of a boron nitride lined carbon mold, or compaction die, large enough to hold the powder charge for elements 1, 2 and 3. Next a powder blend of nominal 7 mole percent thorium oxide in the n type germanium-silicon matrix (for element 2) is added on top of the 12 mole percent thorium oxide in germanium-silicon mix in the compaction die. Following this, a powder blend of a nominal 1 mole percent of thorium oxide in the n type germanium-silicon, used for element 3, is placed on top of the loose powder for element 2. The molecular ratio of elements 1:2:3 of leg 10 is approximately 0.5:1.5:1, respectively, for this example. Other ratios of element quantity of n type legs may be employed. Next, the compaction die is equipped with a male top and bottom ram to form a powder metallurgy hot-press type compaction die assembly. This die assembly is then centered in an induction heating coil and the male rams connected with a means for applying pressure to them. A protective atmosphere of argon is provided for the die assembly and pressure equivalent to 2500 p.s.i. exerted on the loose powder. Upon heating to 1250° C. under the above pressure, compaction is completed in 5 minutes to produce a segmented type element or leg 10 of about 99% of theoretical density for the segments.

Element or leg 11 is produced in a similar manner from a matrix of p type germanium-silicon (500 A. to 450,000 A.) modified by dispersed thorium oxide powder (100 A. to 350,000 A.). The same mole percents of thorium oxide used for elements 1, 2 and 3 are blended with the matrix material to produce elements 6, 7 and 8 of leg 11. The same die materials, as well as compaction temperatures, pressures and other procedures are also used. The molecular ratio of elements 6, 7 and 8 to one another are 0.5:1.5:1, respectively.

The hot electrical and thermal element 5 of the thermoelectric module shown in FIGURE 2 is attached to legs 10 and 11 by simultaneously bonding to element 5 during consolidation of the thermoelectric materials. Element 5, in this particular example consists of graphite while element 4 is commercial molybdenum. Element 4 is attached to the thermoelectric legs by the same technique.

Overall merit factors of $1.1\times10^{-3}/°$ C. and $1.0\times10^{-3}/°$ C. are obtained from segmented type legs 10 and 11, respectively, when such legs consisting of segments or elements 1, 2, 3, 6, 7 and 8 are produced from the said matrix thermoelectric materials modified by homogeneous dispersions of the said refractory materials and the units operated between 300° C. at the cold junction and 800° C. at the hot junction. By comparison, the merit factors are $0.9\times10^{-3}/°$ C. and $0.9\times10^{-3}/°$ C. respectively for legs 10 and 11 comprised of the same composition matrix materials but modified with a homogeneously dispersed 8 mole percent thorium oxide, and operating over this same temperature range. Thus improvements of approximately 20% and 10% are obtained for matrices of n and p type germanium-silicon, respectively, by the compositions, process and configurations of this example.

Similar improvements of merit fectors for various germanium-silicon matrix compositions are obtained through practice of the technique of providing thermoelectric legs comprised of thermoelectric segments of different concentrations of dispersants of refractory particles. While only one refractory dispersant is used in a single thermoelectric matrix per leg in this example, each segment may be readily made of different dispersants. Other concentrations of dispersants that those described in this example may also be used if the concentrations of such dispersants are maintained within the 0.001 mole percent to 29 mole percent range specified in this application. With regard to protective atmospheres used during fabrication, nitrogen, helium and even air can be used. Other electrically and thermally conductive metals may be substituted for graphite and molybdenum as elements 4 and 5 of the typical device shown in FIGURE 2.

The percent cubic expansion and deviation for Examples 4 and 5 are shown for several temperatures in the table below:

| | Percent at 300° C. | Deviation percent | Percent at 600° C. | Deviation percent |
|---|---|---|---|---|
| Ge-Si | 0.54 | 0 | 0.93 | 0 |
| $ThO_2$ | 1.05 | 0.51 | 2.25 | 1.32 |

| | Percent at 800° C. | Deviation percent |
|---|---|---|
| Ge-Si | 1.05 | 0 |
| $ThO_2$ | 3.30 | 2.25 |

*Example 5*

A process similar to that used in Example 4 is employed to fabricate elements 10 and 11 of FIGURE 2 to yield legs in which the thermoelectric properties of a single matrix are smoothly varied to produce legs which operate with higher merit factors over the same temperature drop than legs of constant or uniform composition. For example, continuously varied or gradated composition type legs 10 and 11 for the device shown in FIGURE 2 of this example are produced by feeding a continuously changing composition of thorium oxide modified germanium-silicon constituents into a compaction die. In this manner, the lower portion of element 1 which is to be joined to element 5 of FIGURE 2 is comprised of a 14 mole percent mixture of thorium oxide with n type germanium-silicon. The composition of the succeeding layers of blended powder fed into the compaction die to form element 1 is gradually decreased in thorium oxide content until at the junction of elements 1 and 2 of FIGURE 2 the composition reaches 10 mole percent thorium oxide to yield an average composition for element 1 of about 12 mole percent. The dispersed thorium oxide content is then continuously decreased with increasing layers of powder charged into the die to form elements 2 and 3 with smoothly graduated composition which average 7 mole percent and 0.3 mole percent thorium oxide, respectively. The approximate molecular ratios of elements 1, 2 and 3 of leg 10 are 0.5:1.5:1, as used in Example 4. Following charging of the powder to the die assembly in this way compaction by pressure and elevated temperature proceeds as previously described in Example 4. Elements 6, 7 and 8 of leg 11 are made in the same manner as are elements 1, 2 and 3 of leg 10. Merit factors of $1.2\times10^{-3}/°$ C. and $1.1\times10^{-3}/°$ C., respectively, are produced for legs 10 and 11 in a typical device configuration shown in FIGURE 2 using the smoothly gradated type elements of this example when units of the type shown in FIGURE 2 are operated at temperatures ranging from 300° C. at the cold junction to 800° C. at the hot junction. By comparison, merit factors of $0.9\times10^{-3}/°$ C. and $0.9\times10^{-3}/°$ C. are obtained for elements 10 and 11, respectively, comprised of the same n and p type germanium-silicon thermoelectric components made with homogeneous dispersions using 8 mole percent thorium oxide.

In accordance with known device technology, advantage can be taken of the improved merit factor possible with such smoothly gradated thermoelectric legs to produce more highly efficient power generating and high temperature heating-cooling units either cascading or segmenting typical n and p legs 10 and 11 described in Examples 4 and 5 with thermoelectric materials capable of more efficient operation in temperature ranges beyond the scope of additive-free matrix materials of this invention.

Similar improvements of merit factors for other matrix thermoelectric materials are obtained when smoothly gradated concentrations of dispersants are used to provide thermoelectric legs of gradated thermoelectric properties by the processes used in this example.

*Example 6*

A specific example of typical results in producing superior thermoelectric materials and devices, through the inducement of strain at elevated temperatures into the lattice of the thermoelectric matrix material, so as to beneficially decrease the product of the electrical resistivity and thermal conductivity of such materials through dispersion of refractory phases with higher expansion coefficients relative to the thermal expansion coefficients of matrix materials, is shown by comparing the merit factor obtained for a germanium-silicon thermoelectric matrix material (characterized by 1.05% expansion from 0° C to 800° C.) with 14 mole percent of thorium oxide (characterized by a 3.30% expansion from 0° C. to 800° C.) dispersed in it, to the merit factor for the same composition germanium-silicon matrix in which 14 mole percent of titanium oxide (characterized by a 0.75% expansion from 0° C. to 800° C.) is used as the dispersed phase. Individual thermoelectric elements, such as element 20 of FIGURE 1, produce under identical pressing conditions and by incorporating the above quantities of thoria and titania in an identical matrix material when each of the individual thermoelectric elements is attached with proper leads (elements 21 and 22 of FIGURE 1) to a measuring circuit 23, exhibit different merit factors when operated over the same temperature drop. Specifically, a merit factor of $1.0 \times 10^{-3}/°$ C. at 800° C. is obtained for the thermoelectric germanium-silicon matrix material in which 14 mole percent thorium oxide is homogeneously dispersed prior to hot pressing at 1250° C. and 1500 p.s.i. By comparison, an identical germanium-silicon matrix composition in which 14 mole percent titanium-oxide is homogeneously blended prior to compacting into a test piece under identical temperatures and pressure fabrication conditions, as well as being fabricated with identical thermal and electrical contacts, exhibits a merit factor of only $0.5 \times 10^{-3}/°$ C. at 800° C.

The percent cubic expansion and deviation are shown in the table below:

| | Percent at 800° C. | Deviation percent |
|---|---|---|
| Ge-Si | 1.05 | 0 |
| $ThO_2$ | 3.30 | 2.25 |
| $TiO_2$ | 0.75 | 0.30 |

The decrease in the merit factor for the matrix material modified with titanium oxide as compared with the one in which thorium oxide is dispersed is larger than could be accounted for by the relative thermal and electrical conductivities of the dispersants. The results obtained are more in line with the relative degree of matrix lattice strain that is estimated from the deviation of the percent of cubic expansion of each dispersant used. That is, the thermoelectric properties of the matrix material are enhanced at high temperature when the coefficient of expansion of the dispersant is within the described deviation limits from that of the matrix material, with wider deviating dispersants yielding the greatest benefit to thermoelectric materials for use at elevated temperatures. These beneficial effects are obtained with p and n type matrices of the present invention.

Use of dispersed phases deviating in percent of thermal expansion from that of germanium-silicon matrices permits employment of high-temperature flame and plasma spray apparatus to economically produce large area (high power) thermoelectric elements in a variety of geometries and without the use of high forming pressures. Costly dies and die-heating apparatus are minimized as proper selection of the dispersed phase creates the beneficial lattice stress and strain effect desired.

*Example 7*

A specific example of the power producing characteristics of devices made in accordance with the present invention is shown when a simple thermoelectric device consisting of a modified matrix unit as described in Example 1 is equipped with electrical and thermal contacts, elements 21 and 22 of FIGURE 1 and connected to a matched resistance load and powermeter. When an energy source is used to heat the hot junction of this unit to 800° C. and a calorimetric heat sink provided to cool the cold junction of this unit to 200° C., 0.42 watts of electrical power output are produced for a heat power input of 13.5 B.t.u. per hour. For comparison, the power output of an unmodified matrix unit of the same cross sectional area of Example 1 is only 0.23 watts for the same heat power input. The advantage of the modified matrix material over the unmodified is a significant 83% increase in power generation capability, under the same temperature or thermal flux conditions.

*Example 8*

As shown in FIGURE 6, thermoelectric matrices modified through the use of insoluble dispersants show significantly less degradation with time when exposed to elevated temperatures than matrices of the same composition without dispersants. For example, when n and p type germanium (30 mole percent)-silicon (70 mole percent) matrix materials are modified with 6 mole percent silicon nitride to produce n and p type thermoelectric units, such as shown in FIGURE 1, little or no degradation (as noted by change in merit factor) is noted after 3000 hours operation of such units at 1000° C. On the other hand, the merit factor of the same geometry thermal and electrical contacts and with the same n and p germanium-silicon matrix compositions decrease appreciably (about 30%) when operated at the same temperature for the same length of time. Such increased stability of merit factors is quite valuable for application in space or remote regions on earth where it is desirable for thermoelectric generators to operate for extended periods with no attention or maintenance.

What is claimed is:

1. As an article of manufacture, a shaped, semiconductor two-phase body comprising a matrix of consolidated germanium and silicon in the proportion of between 20 mole percent to 75 mole percent germanium, and 80 mole percent to 25 mole percent silicon, the said matrix having dispersed therein a particulate material selected from the group consisting of the stable binary sulfides, oxides, borides, carbides, nitrides, silicides, and phosphides of boron, thorium, aluminum, magnesium, calcium, titanium, zirconium, tantalum, silicon, vanadium, hafnium, columbium, tungsten, iron, cobalt, nickel, rhenium, molybdenum, beryllium, barium and rare earths of the lanthanide and actinide series, the said dispersant being present in the range of from 0.001 mole percent to 29 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 1.03% to 4.00% over the range of 0° C. to 1000° C.

2. A thermoelectric unit comprising at least one shaped, semiconductor two-phase body, and electrical leads at opposed portions of the said body, the said body comprising a matrix of a combination of between 20 mole percent to 75 mole percent of germanium, and 80 mole percent to 25 mole percent of silicon and having dispersed within the said matrix, particles of calcium oxide present at from 0.001 mole percent to 29 mole percent of the matrix, the said calcium oxide dispersant being characterized by a solubility in the matrix of less than 10 mole percent at a temperature which is 60% of the absolute melting point of the matrix, and a percent cubic thermal expansion which differs arithmetically from that of the matrix by a deviation of from 1.03% to 4.00%, over the range of from 0° C. to 1000° C.

3. A thermoelectric unit comprising at least one shaped, semiconductor two-phase body, and electrical leads at opposed portions of the said body, the said body comprising a matrix of a combination of between 20 mole percent to 75 mole percent of germanium, and 80 mole percent to 25 mole percent of silicon and having dispersed within the said matrix, particles of thorium oxide present at from 0.001 mole percent to 29 mole percent of the matrix, the said thorium oxide dispersant being characterized by a solubility in the matrix of less than 10 mole percent at a temperature which is 60% of the absolute melting point of the matrix, and a percent cubic thermal expansion which differs arithmetically from that of the matrix by a deviation of from 1.03% to 4.00%, over the range of from 0° C. to 1000° C.

4. A thermoelectric unit comprising at least one shaped, semiconductor two-phase body, and electrical leads at opposed portions of the said body, the said body comprising a matrix of a combination of between 20 mole percent to 75 mole percent of germanium and 80 mole percent to 25 mole percent of silicon and having dispersed within the said matrix, particles of silicon nitride present at from 0.001 mole percent to 29 mole percent of the matrix, the said silicon nitride dispersant being characterized by a solubility in the matrix of less than 10 mole percent at a temperature which is 60% of the absolute melting point of the matrix, and a percent cubic thermal expansion which differs arithmetically from that of the matrix by a deviation of from 1.03% to 4.00% over the range of from 0° C. to 1000° C.

5. A thermoelectric unit comprising at least one shaped, semiconductor two-phase body, and electrical leads at opposed portions of the said body, the said body comprising a matrix of a combination of between 20 mole percent to 75 mole percent germanium and 80 mole percent to 25 mole percent of silicon, and having dispersed within the said matrix particles of thorium oxide present at from 0.001 mole percent to 29 mole percent of the matrix, the said thorium oxide dispersant also being characterized by a solubility in the matrix of less than 10 mole percent at a temperature which is 60% of the absolute melting point of the matrix, and a percent cubic thermal expansion which differs arithmetically from that of the matrix by a deviation of from 1.03% to 4.00% over the range of from 0° C. to 1000° C., the proportion of the said dispersant differing in one region of the said body from the proportion thereof at another region of the said body.

6. A thermoelectric unit comprising at least one shaped, semiconductor two-phase body, electrical leads at opposed portions of the said body, the said body comprising a matrix of consolidated germanium and silicon in the proportion of between 20 mole percent to 75 mole percent germanium and 80 mole percent to 25 mole percent silicon, the said matrix having dispersed therein a particulate material selected from the group consisting of stable binary sulfides, oxides, borides, carbides, nitrides, silicides, and phosphides of boron, thorium, aluminum, magnesium, calcium, titanium, zirconium, tantalum, silicon, vanadian, hafnium, columbium, tungsten, iron, cobalt, nickel, rhenium, molybdenum, beryllium, barium and rare earths of the lanthanide and actinide series, the said dispersant being present in the range of from 0.001 mole percent to 29 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 1.03% to 4.00% over the range of from 0° C. to 1000° C.

7. A thermoelectric unit as described in claim 6 in which there is a gradation in concentration of the dispersed particulate additive material from the respective opposed regions to be subjected to heat and to cold.

8. Process for converting heat into electricity which comprises applying heat to a hot junction element in physical and electrical contact with a first leg of p-type conductivity, and a second leg of n-type conductivity, said legs and hot junction element forming a first thermoelectric junction, at least one of said legs being comprised of a matrix of consolidated germanium and silicon in the proportion of between 20 mole percent to 75 mole percent germanium and 80 mole percent to 25 mole percent silicon, the said matrix having uniformly dispersed therein a particulate dispersant selected from the group consisting of stable binary sulfides, oxides, borides, carbides, nitrides, silicides, and phosphides of boron, thorium, aluminum, magnesium, calcium, titanium, zirconium, tantalum, silicon, vanadium, hafnium, columbium, tungsten, iron, cobalt, nickel, rhenium, molybdenum, beryllium, barium and rare earths of the lanthanide and actinide series, the said dispersant being present in the range of from 0.001 mole percent to 29 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 1.03% to 4.00% over the range of from 0° C. to 1000° C. cooling the cold junction element in physical and electrical contact with said first and second legs, remote from the said hot junction and forming a second thermoelectric junction, and withdrawing electricity from said cold junction.

9. Process for converting heat into electricity which comprises applying heat to a hot junction element in physical and electrical contact with a first leg, of p-type conductivity, and a second leg of n-type conductivity, said legs and hot junction element forming a first thermoelectric junction, at least one of said legs being comprised of a matrix of consolidated germanium and silicon in the proportion of between 25 mole percent to 70 mole percent germanium and 75 mole percent to 30 mole percent silicon, the said matrix having uniformly dispersed therein a particulate dispersant selected from the group consisting of stable binary sulfides, oxides, borides, carbides, nitrides, silicides, and phosphides of boron, thorium, aluminum, magnesium, calcium, titanium, zirconium, tantalum, silicon, vanadium, hafnium, columbium, tungsten, iron, cobalt, nickel, rhenium, molybdenum, beryllium, barium, and rare earths of the lanthanide and actinide series, the said dispersant being present in the range of from 0.01 mole percent to 20 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 1.19% to 4.00% over the range of from 0° C. to 1000 C. cooling the cold junction element in physical and electrical contact with said first and second legs, remote from the said hot junction and forming a second thermoelectric junction, and withdrawing electricity from said cold junction.

10. Process for converting heat into electricity which comprises applying heat to a hot junction element in physical and electrical contact with a first leg, of p-type conductivity, and a second leg of n-type conductivity, said legs and hot junction element forming a first thermoelectric junction, at least one of said legs being comprised of a matrix of consolidated germanium and silicon in the proportion of between 28 mole percent to 65 mole percent germanium, and 72 mole percent to 35 mole percent silicon, the said matrix having uniformly dispersed therein a particulate dispersant selected from the group consisting of stable binary sulfides, oxides, borides, carbides, nitrides, silicides, and phosphides of boron, thorium, aluminum, magnesium, calcium, titanium, zirconium, tantalum, silicon, vanadium, hafnium, columbium, tungsten, iron, cobalt, nickel, rhenium, molybdenum, beryllium, barium and rare earths of the lanthanide and actinide series, the said dispersant being present in the range of from 0.1 mole percent to 15 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 1.35% to 4.00% over the range of from 0° C. to 1000° C. cooling the cold junction element in physical and electrical contact with said first and second legs, remote from the said hot junction and forming a second thermoelectric junction, and withdrawing electricity from said cold junction.

11. The process for converting electricity into cooling and heating effects which comprises applying electricity to a cold junction element in physical and electrical contact with a first leg of p-type conductivity, and a second leg of n-type conductivity, said legs, and cold junction elements forming a first thermoelectric junction and said legs and a hot junction forming a second thermoelectric junction, at least one of said legs being comprised of a matrix of germanium and silicon in the proportion of between 20 mole percent to 75 mole percent germanium and 80 mole percent to 25 mole percent silicon, the said matrix having dispersed therein a particulate material selected from the group consisting of stable binary sulfides, oxides, borides, carbides, nitrides, silicides, and phosphides of boron, thorium, aluminum, magnesium, calcium, titanium, zirconium, tantalum, silicon, vanadium, hafnium, columbium, tungsten, iron, cobalt, nickel, rhenium, molybdenum, beryllium, barium and rare earths of the lanthanide and actinide series, the said dispersant being present in the range of from 0.001 mole percent to 29 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 1.03% to 4.00% over the range of from 0° C. to 1000° C. thereby cooling the cold junction element in physical and electrical contact with said first and second legs, remote from the said hot junction and forming a second thermoelectric junction, and cooling the said cold junction.

References Cited by the Examiner

UNITED STATES PATENTS

| | | | |
|---|---|---|---|
| 775,188 | 11/1904 | Lyons et al. | 136—5.4 |
| 885,430 | 4/1908 | Bristol | 136—5.4 |
| 1,019,390 | 3/1912 | Weintraub | 23—209 |
| 1,075,773 | 10/1913 | Ferra | 136—5.5 |
| 1,079,621 | 11/1913 | Weintraub | 136—5 |
| 1,127,424 | 2/1915 | Ferra | 136—5.4 |
| 2,841,559 | 7/1958 | Rosi | 252—62.3 |
| 2,937,218 | 5/1960 | Sampietro | 136—4 |
| 2,955,145 | 10/1960 | Schrewelius | 136—5 |
| 2,997,515 | 8/1961 | Sampietro | 136—4 |
| 3,051,767 | 8/1962 | Fredrick et al. | 136—5 |

OTHER REFERENCES

Condensed Chemical Dictionary, 6th edition, Reinhold Publishing Co., New York (1961).

Fuschillo, N., In "Proc. Phys. Soc. (London)," BLVX: p. 896 (1952).

Herman F., In "Proc. of the Inst. of Radio Eng.," $43^2$: p. 1703 (1955).

Levitas, A., In "Physical Review," 99(6): p. 1810 (1955).

WINSTON A. DOUGLAS, *Primary Examiner.*

JOHN H. MACK, *Examiner.*

A. BEKELMAN, *Assistant Examiner.*

UNITED STATES PATENT OFFICE
CERTIFICATE OF CORRECTION

Patent No. 3,285,017 November 15, 1966

Courtland M. Henderson et al.

It is certified that error appears in the above identified patent and that said Letters Patent are hereby corrected as shown below:

Column 5, line 26, "72 mole silicon." should read -- 72 mole percent silicon. --; line 60, "(e.g., 100° C.)" should read -- (e.g., 1000° C.) --. Column 6, in the table, first column, line 2 thereof, "CeO" should read -- CaO --. Column 8, line 10, cance "terial"; same column, in the heading to the table, second colum "Percent at 800° C." should read -- Percent at 850° C. --. Column 10, line 55, "graduated" should read -- gradated --.

Signed and sealed this 18th day of November 1969.

(SEAL)
Attest:

Edward M. Fletcher, Jr.
Attesting Officer

WILLIAM E. SCHUYLER, JR.
Commissioner of Patents